United States Patent [19]

Larson et al.

[11] 4,418,239

[45] Nov. 29, 1983

[54] FLEXIBLE CONNECTOR WITH INTERCONNECTION BETWEEN CONDUCTIVE TRACES

[75] Inventors: Willis A. Larson; Anthony J. Van Zeeland, both of Crystal Lake, Ill.

[73] Assignee: Oak Industries Inc., Rancho Bernardo, Calif.

[21] Appl. No.: 295,528

[22] Filed: Aug. 24, 1981

[51] Int. Cl.³ .............................. H01B 7/08
[52] U.S. Cl. .................. 174/34; 174/117 FF; 361/398
[58] Field of Search ............ 174/32, 33, 34, 117 FF, 174/117 PC; 361/398

[56] References Cited

U.S. PATENT DOCUMENTS

| | | | |
|---|---|---|---|
| 3,383,564 | 5/1968 | Lalmond et al. | 361/398 X |
| 3,484,654 | 12/1969 | Honeiser | 361/398 X |
| 3,612,743 | 10/1971 | Angele | 174/117 FF X |
| 3,718,876 | 2/1973 | Fletcher | 361/398 X |
| 3,761,842 | 9/1973 | Gandrud | 174/34 X |
| 3,967,162 | 6/1976 | Ceresa et al. | 361/398 |
| 4,026,011 | 5/1977 | Walton | 361/398 X |
| 4,251,683 | 2/1981 | Oughton, Jr. et al. | 174/117 FF X |
| 4,261,042 | 4/1981 | Ishiwatari et al. | 361/398 X |
| 4,314,117 | 2/1982 | Ditzig | 361/398 X |
| 4,362,899 | 12/1982 | Borrill | 174/32 X |

Primary Examiner—A. T. Grimley
Assistant Examiner—Morris H. Nimmo
Attorney, Agent, or Firm—Kinzer, Plyer, Dorn & McEachran

[57] ABSTRACT

A flexible connector includes a flat thin insulating base and a plurality of spaced conductive paths formed thereon. There are means for providing selective interconnection between certain conductive paths on the base, which means includes a thin defined insulating patch positioned upon a selective area of the base and conductive paths. A connecting conductive path is formed on the insulating patch and extends therethrough into electrical contact with said certain conductive paths.

10 Claims, 3 Drawing Figures

U.S. Patent  Nov. 29, 1983  4,418,239
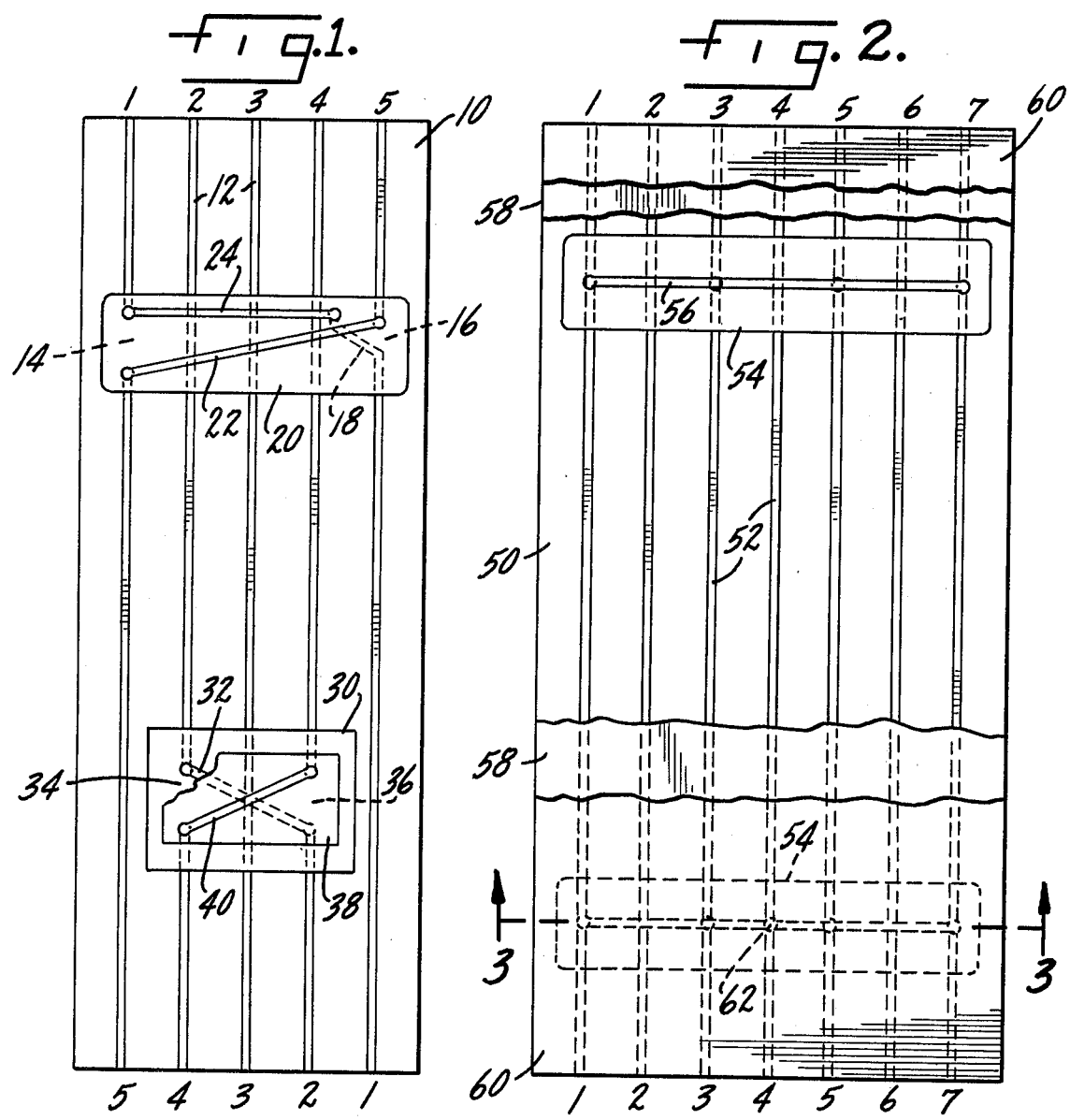
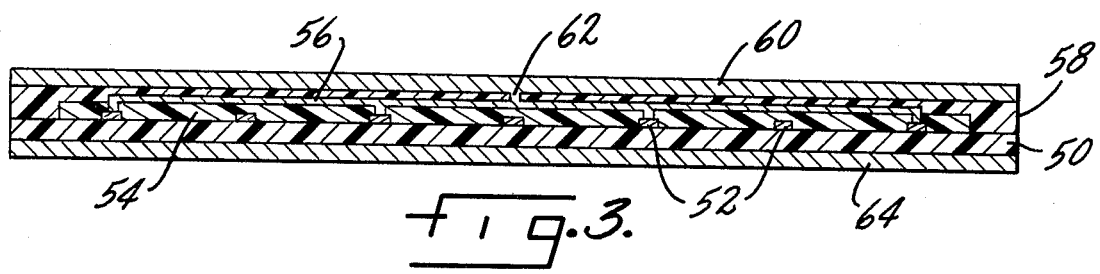

FLEXIBLE CONNECTOR WITH INTERCONNECTION BETWEEN CONDUCTIVE TRACES

SUMMARY OF THE INVENTION

The present invention relates to a flexible connector, often described as a tail, which is used in membrane switch and printed circuit technology to form a connection between a membrane switch and associated electrical equipment such as a printed circuit board. In particular, the invention relates to such a flexible connector which includes a means for selective interconnection of certain designated conductive paths formed thereon.

One purpose of the invention is a flexible connector of the type described in which certain designated conductive paths are interconnected to form a common ground, thereby eliminating crosstalk between adjacent paths on the connector.

Another purpose is a flexible connector of the type described including a shield on one or both sides thereof, which shield is in circuit with said interconnected ground conductive paths.

Another purpose is a flexible connector of the type described including means for transposing designated conductive paths from one location to another on the connector.

Another purpose is a flexible connector of the type described including a thin insulating base having a plurality of spaced generally parallel conductive paths thereon, and means for cross-connecting certain designated paths.

Other purposes will appear in the ensuing specification, drawings and claims.

BRIEF DESCRIPTION OF THE DRAWINGS

The invention is illustrated diagrammatically in the following drawings wherein:

FIG. 1 is a plan view of one embodiment of the invention,

FIG. 2 is a plan view of a modified form of the invention,

FIG. 3 is a section along plane 3—3 of FIG. 2.

DESCRIPTION OF THE PREFERRED EMBODIMENT

In the membrane switch and printed circuit technology, it is necessary to provide interconnects between the switch and the ancillary electrical equipment. Conventionally, such interconnects are formed by tails which extend outwardly from the membrane switch and may in fact be a part of the membrane switch. Such tails may have a thin plastic insulating base, normally in the form of a film of polyester or one of the large number of similar materials which are satisfactory for such purpose. Usually there are a plurality of spaced parallel conductive paths formed on the tail. Often it is required that there be a transposition of the position of the conductive paths on the tail, as the relative position of the electrical traces on the switch and the relative position of the electrical traces on the printed circuit board, if that is to be the use of the tail, are not necessarily the same. Similarly, if such interconnects or tails are to carry high frequency signals, there is the possibility of crosstalk between adjacent conductive paths as the paths are quite close together, for example on the order of 0.050 inch or the like.

The present invention provides a means for transposing the positions of the conductors on the flexible connector, as well as providing a means for establishing a ground path or paths on the connector to isolate the various electrically conductive paths and thereby prevent crosstalk.

Although the invention will be described in connection with membrane switch and printed circuit technology, it should be understood that the electrical connector described has wider application. Specifically, the connector provides a means for interconnecting any spaced electrical circuits in which there are a plurality of conductive paths therebetween.

In FIG. 1, a flat thin insulating base 10 may be formed of any one of a number of thin films such as a polyester, a polycarbonate or a polyvinylfluoride. A plurality of conductive paths or traces are indicated at 12 with each of the traces bearing a circuit number across the top of 1, 2, 3, 4 or 5. It should be noted at the bottom or opposite end of base 10 the traces have the reverse number designation. As will be explained hereinafter, the circuit paths are transposed between opposite ends of the connector. The conductive traces or circuit paths may be formed of a suitable conductive ink and conventionally will be silkscreened onto the substrate or base 10.

As indicated above, in certain applications it is necessary to transpose or reposition the conductive paths. For example, circuit 1 may be at one side of the connector at one end, but it is necessary for this particular conductive path to be at the opposite side or at a different position at the other end of the connector. The structure of FIG. 1 provides a means for transposing conductive paths. Specifically, looking at the upper portion of FIG. 1, there is a discontinuity 14 in conductive path 1 and a similar discontinuity 16 in conductive path 5. In the case of the discontinuity in conductive path 5, it should be noted that the upstream end of conductive path 5 has an offset portion 18 which bends toward conductive path 4.

To provide an interconnect or transposition, the first step is to apply a thin insulating path 20 which may be silkscreened onto base 10 and the conductive traces or may be in the form of a film patch which is adhesively applied. In either event, it should be noted that the discontinuities in conductive paths 1 and 5 are covered by patch 20. To complete the transposition, the downstream side of conductive path 5 is connected by a conductive path 22 to the upstream side of conductive path 1, thereby transposing the position of conductive path 5 from the far right to the far left. In like manner, the downstream side of conductive path 1 is connected by a circuit path or conductive path 24 to the circuit path 1 from the far left side to the far right side. Conductive paths 22 and 24 may be silkscreened onto insulating path 20 and there will be openings in the insulating patch in alignment with the termination or upstream and downstream ends of the conductive paths. These openings may be provided when the insulating patch is initially applied and when the connecting conductive paths 22 and 24 are silkscreened onto the insulating patch, the conductive ink will flow into the openings, thereby providing the described interconnect.

The lower portion of FIG. 1 shows another arrangement for transposing circuit conductors, in this case the transposition of conductive paths 2 and 4. A first insulating patch 30 is applied in the manner described. The patch may cover the entire group of conductive paths, or just the three center paths if that is all that is involved. A first interconnecting conductive path 32 is then applied, again preferably by silkscreening, to connect the downstream side of conductive path 2 with the upstream side of conductive path 4. Again, there are discontinuities 34 and 36 in both conductive paths 2 and 4 in the area of the transposition. After conductive path 32 has been applied, a second insulating patch 38 is applied over the conductive path and a second interconnect path 40 is applied to the second insulating patch whereby the downstream side of conductive path 4 is connected to the upstream side of conductive path 2.

The transposition or repositioning of conductive paths such as described in changing conductive paths 2 and 4, or in connection with changing conductive paths 1 and 5, may be located at any point on the connector. Any two conductive paths may be interchanged and the 1–5 and 2–4 transpositions are only illustrative examples.

In the construction of FIGS. 2 and 3, there is a base 50 which has a plurality of generally parallel conductive paths 52 which are designated as paths 1 through 7. In the FIG. 2 and 3 construction, the conductive paths are not repositioned, but rather certain designated paths are connected together, for example to provide a common ground connection. This is a particularly advantageous arrangement when intermediate paths are carrying high frequency RF signals which need to be electrically isolated from each other. For example, if paths 1, 3, 5 and 7 are commonly connected as a ground, then there will be no crosstalk between paths 2 and 4 or paths 4 and 6.

The interconnecton in this case does not require a discontinuity as did the transposition of FIG. 1. An insulating patch 54 is applied adjacent one end of the connector and an interconnecting conductive path 56 is placed upon the insulating patch. There will be openings in alignment with conductive paths 1, 3, 5 and 7 so that when the interconnecting path 56 is silkscreened onto the insulating patch, the conductive ink will flow down and make electrical and mechanical contact with the designated conductive paths. Thus, at the top of FIG. 2, or adjacent one end of the connector, conductive paths 1, 3, 5 and 7 are commonly connected together and this may be a ground connection. Preferably, there will be such an interconnect at both ends of the connector, as is indicated by broken lines at the opposite end of the connector of FIG. 2.

In some applications it is desired for the connector to have a shield, in concept like a coaxial cable, to again prevent RF interferance with the signals being carried by the connector. FIG. 3 is a section through the connector of FIG. 2 and illustrates the application of such a shield. After the conductive interconnect 56 has been applied over insulating patch 54, the entire surface of base 50 is covered by a layer of insulation 58, which may be applied in liquid form, for example by silkscreening or in the form of a film. After insulation 58 has been applied, a layer of conductive material, for example a conductive ink, as indicated at 60, may be applied over the layer of insulation. The conductive layer 60 may connect with interconnect 56 through an opening in insulation 58, indicated at 62. Thus, the outer shield will be in electrical circuit with the interior ground.

In like manner, the lower surface of base 50, or the surface which does not have conductive traces applied thereto, may have a further shield layer 64 which may or may not be in electrical circuit with the interior ground and shield 60 at the opposite side of the connector.

Of importance in the FIG. 2 and 3 construction is not only the interconnect between spaced and preferably alternate conductive paths, thereby providing a ground and isolation barrier between intermediate conductive paths which may be carrying RF signals, but also the exterior shield which will prevent exterior signal interference from distorting the signals actually on the conductive paths of the connector, and also prevent radiation from the connector itself from interfering with adjacent and auxiliary electrical components.

Whereas the preferred form of the invention has been shown and described herein, it should be realized that there may be many modifications, substitutions and alterations thereto.

The embodiments of the invention in which an exclusive property or privilege is claimed are defined as follows:

1. A flexible connector including a flat thin insulating base, a plurality of spaced conductive paths formed o one side thereof, and means for providing selective interconnection between certain conductive paths including a thin defined insulating patch positioned upon a selective area of said base and conductive paths, and a connecting conductive path on said insulating patch and extending therethrough into electrical contact with said certain conductive paths.

2. The flexible connector of claim 1 further characterized in that said connecting conductive path interconnects more than two of said plurality of spaced conductive paths.

3. The flexible connector of claim 1 further characterized in that said certain conductive paths are discontinuous in the area of said patch, with said connecting conductive path connecting the upstream side of one of said certain conductive paths with the downstream side of another of said certain conductive paths.

4. A flexible connector including a flat thin insulating base, a plurality of spaced generally parallel conductive paths formed thereon, and means for transposing the position of two of said conductive paths on said base including a discontinuity in said two conductive paths, a thin insulating patch positioned over said base and said conductive paths in the area of said discontinuities, and interconnecting conductive paths positioned on said insulating patch and connecting the downstream side of one of said two conductive paths and the upstream side of the other of said two conductive paths, and connecting the upstream side of said one conductive path and the downstream side of said other conductive path.

5. The flexible connector of claim 4 further characterized in that said insulating patch covers the downstream and upstream ends of the discontinuities in said two conductors.

6. The flexible connector of claim 5 further characterized in that there are openings in said patch in alignment with the upstream and downstream ends of said discontinuities.

7. The flexible connector of claim 4 further characterized in that one of said interconnecting conductive paths is positioned on said insulating patch, a second insulating patch covering said one interconnecting conductive path and said first insulating patch, with the other interconnecting conductive path being positioned on said second insulating patch.

8. A flexible connector including a flat thin insulating base, a plurality of spaced generally parallel conductive paths formed on one side thereof, and means for commonly connecting certain of said conductive paths including a thin defined insulating patch positioned upon an area of said base and a plurality of said conductive paths, and a connecting conductive path on said insulating patch and extending therethrough into electrical contact with said certain conductive paths.

9. The flexible connector of claim 8 further characterized by and including a layer of insulation covering said base and conductive paths, and a conductive shield covering said layer of insulation, said conductive shield being electrically connected to said connecting conductive path.

10. The flexible connector of claim 9 further characterized by and including a conductive shield covering the side of said base opposite to that having said conductive paths.

* * * * *